United States Patent
Dunn

(10) Patent No.: US 7,932,017 B2
(45) Date of Patent: *Apr. 26, 2011

(54) METHOD OF DOUBLE PATTERNING A THIN FILM USING A DEVELOPABLE ANTI-REFLECTIVE COATING AND A DEVELOPABLE ORGANIC PLANARIZATION LAYER

(75) Inventor: Shannon W. Dunn, Altamont, NY (US)

(73) Assignee: Tokyo Electron Limited, Tokyo (JP)

( * ) Notice: Subject to any disclaimer, the term of this patent is extended or adjusted under 35 U.S.C. 154(b) by 913 days.

This patent is subject to a terminal disclaimer.

(21) Appl. No.: 11/623,237

(22) Filed: Jan. 15, 2007

(65) Prior Publication Data

US 2008/0171293 A1 Jul. 17, 2008

(51) Int. Cl.
  *G03F 7/22* (2006.01)
(52) U.S. Cl. .......................... 430/323; 430/322; 430/394
(58) Field of Classification Search .................... None
  See application file for complete search history.

(56) References Cited

U.S. PATENT DOCUMENTS

| | | | |
|---|---|---|---|
| 5,753,417 | A | 5/1998 | Ulrich |
| 7,432,191 | B1 | 10/2008 | Stamper et al. |
| 2002/0081531 | A1 | 6/2002 | Jain |
| 2003/0129531 | A1 | 7/2003 | Oberlander et al. |
| 2003/0205658 | A1 | 11/2003 | Voisin |
| 2005/0074699 | A1 | 4/2005 | Sun et al. |
| 2005/0116231 | A1 | 6/2005 | Kang et al. |
| 2005/0153538 | A1 | 7/2005 | Tsai et al. |
| 2005/0167394 | A1 | 8/2005 | liu et al. |
| 2006/0003268 | A1 | 1/2006 | Hong et al. |
| 2006/0177772 | A1 | 8/2006 | Abdallah et al. |
| 2006/0222968 | A1 | 10/2006 | Talin et al. |
| 2006/0223245 | A9* | 10/2006 | Pellens et al. .................. 438/167 |
| 2006/0290012 | A1 | 12/2006 | Sadjadi |
| 2007/0077523 | A1* | 4/2007 | Finders .......................... 430/311 |
| 2007/0148598 | A1 | 6/2007 | Colburn et al. |
| 2007/0166648 | A1 | 7/2007 | Ponoth et al. |
| 2008/0020327 | A1 | 1/2008 | Yang et al. |
| 2008/0076074 | A1* | 3/2008 | Dunn ............................ 430/312 |

OTHER PUBLICATIONS

U.S. Patent and Trademark Office, Final Office Action received in related U.S. Appl. No. 11/534,365 dated Mar. 19, 2009, 16 pp.
State Intellectual Property Office of the People's Republic of China, First Office Action received in related Chinese Patent Application No. 200710151302.9 dated Jan. 16, 2009, 7 pp.
U.S. Patent and Trademark Office, Non-final Office Action received in related U.S. Appl. No. 11/534,261 dated Jan. 15, 2009, 12 pp.
U.S. Patent and Trademark Office, Non-final Office Action received in related U.S. Appl. No. 11/534,477 dated Jan. 12, 2009, 14 pp.
U.S. Patent and Trademark Office, Non-final Office Action received in related U.S. Appl. No. 11/534,420 dated Dec. 23, 2008 23 pp.
U.S. Patent and Trademark Office, Non-final Office Action received in related U.S. Appl. No. 11/623,247 dated Oct. 9, 2008, 14 pp.
U.S. Patent and Trademark Office, Non-final Office Action received in related U.S. Appl. No. 11/534,365 dated Jun. 24, 2008, 14 pp.
U.S. Patent and Trademark Office, Non-final Office Action received in related U.S. Appl. No. 11/534,477 dated Jun. 23, 2008, 22 pp.
U.S. Patent and Trademark Office, Non-final Office Action received in related U.S. Appl. No. 11/534,261 dated Jun. 23, 2008, 14 pp.
European Patent Office, International Search Report and Written Opinion received in related PCT Application No. PCT/US2007/077166 dated Dec. 20, 2007, 13 pp.
U.S. Patent and Trademark Office, Non-final Office Action received in related U.S. Appl. No. 11/534,365 dated Sep. 4, 2009, 15 pp.
U.S. Patent and Trademark Office, Final Office Action received in related U.S. Appl. No. 11/534,261 dated Aug. 28, 2009, 12 pp.
U.S. Patent and Trademark Office, Final Office Action received in related U.S. Appl. No. 11/534,477 dated Aug. 7, 2009, 17 pp.
U.S. Patent and Trademark Office, Non-final Office Action received in related U.S. Appl. No. 11/534,538 dated Jul. 13, 2009, 16 pp.
U.S. Patent and Trademark Office, Non-final Office Action received in related U.S. Appl. No. 11/623,247 dated Jun. 2, 2009, 17 pp.
U.S. Patent and Trademark Office, Non-final Office Action received in related U.S. Appl. No. 11/534,477 dated Oct. 23, 2009, 16 pp.
U.S. Patent and Trademark Office, Final Office Action received in related U.S. Appl. No. 11/623,247 dated Dec. 18, 2009, 18 pp.
U.S. Patent and Trademark Office, Final Office Action received in related U.S. Appl. No. 11/534,538 dated Jan. 26, 2010, 12 pp.
U.S. Patent and Trademark Office, Non-final Office Action received in related U.S. Appl. No. 11/534,365 dated Feb. 22, 2010, 18 pp.
U.S. Patent and Trademark Office, Advisory Action received in related U.S. Appl. No. 11/623,247 dated Mar. 10, 2010, 7 pp.
U.S. Patent and Trademark Office, Non-final Office Action received in related U.S. Appl. No. 11/534,261 dated Apr. 5, 2010, 13 pp.
U.S. Patent and Trademark Office, Non-final Office Action received in related U.S. Appl. No. 11/534,538 dated Apr. 12, 2010, 15 pp.
U.S. Patent and Trademark Office, Final Office Action received in related U.S. Appl. No. 11/534,477 dated Apr. 30, 2010, 10 pp.
U.S. Patent and Trademark Office, Non-Final Office Action received in related U.S. Appl. No. 11/534,477 dated Jul. 22, 2010, 14 pp.
U.S. Patent and Trademark Office, Final Office Action received in related U.S. Appl. No. 11/534,365 dated Aug. 20, 2010, 13 pp.
U.S. Patent and Trademark Office, Final Office Action received in related U.S. Appl. No. 11/534,261 dated Oct. 19, 2010, 14 pp.

* cited by examiner

*Primary Examiner* — Daborah Chacko Davis
(74) *Attorney, Agent, or Firm* — Wood, Herron & Evans, LLP

(57) ABSTRACT

A method of double patterning a thin film is described. The method comprises forming a thin film to be patterned on a substrate, forming an organic planarization layer (OPL) on the thin film, forming an anti-reflective coating (ARC) layer on the OPL, and forming a mask layer on the ARC layer. Thereafter, the mask layer is patterned to form a first pattern and a second pattern therein, and the first and second patterns are transferred to the ARC layer and partially or fully transferred to the OPL using a transfer process, such as an imaging and developing process. During a partial pattern transfer to the OPL, the mask layer is removed and the first pattern and second patterns are completely transferred to the OPL using an etching process. Thereafter, the first and second patterns in the OPL are transferred to the underlying thin film using another etching process.

22 Claims, 10 Drawing Sheets

METHOD OF DOUBLE PATTERNING A THIN FILM USING A DEVELOPABLE ANTI-REFLECTIVE COATING AND A DEVELOPABLE ORGANIC PLANARIZATION LAYER

CROSS-REFERENCE TO RELATED APPLICATIONS

This application is related to co-pending U.S. patent application Ser. No. 11/623,247, entitled "METHOD OF PATTERNING AN ORGANIC PLANARIZATION LAYER", filed on even date herewith; pending U.S. patent application Ser. No. 11/534,261, entitled "METHOD AND SYSTEM FOR DOUBLE IMAGING A DEVELOPABLE ANTI-REFLECTIVE COATING", filed on Sep. 22, 2006; pending U.S. patent application Ser. No. 11/534,365, entitled "METHOD AND SYSTEM FOR DOUBLE PATTERNING A DEVELOPABLE ANTI-REFLECTIVE COATING", filed on Sep. 22, 2006; pending U.S. patent application Ser. No. 11/534,420, entitled "METHOD OF PATTERNING AN ANTI-REFLECTIVE COATING BY PARTIAL ETCHING", filed on Sep. 22, 2006; pending U.S. patent application Ser. No. 11/534,477, entitled "METHOD OF PATTERNING A DEVELOPABLE ANTI-REFLECTIVE COATING BY PARTIAL DEVELOPING", filed on Sep. 22, 2006; and pending U.S. patent application Ser. No. 11/534,538, entitled "METHOD FOR DOUBLE PATTERNING A THIN FILM", filed on Sep. 22, 2006. The entire contents of these applications are herein incorporated by reference in their entirety.

BACKGROUND OF THE INVENTION

1. Field of the Invention

The present invention relates to a method for double patterning a thin film on a substrate, and more particularly to a method for double patterning a thin film on a substrate using a developable anti-reflective coating (ARC) layer and a developable organic planarization layer (OPL).

2. Description of Related Art

In material processing methodologies, pattern etching comprises the application of a thin layer of light-sensitive material, such as photo-resist, to an upper surface of a substrate that is subsequently patterned in order to provide a mask for transferring this pattern to the underlying thin film on a substrate during etching. The patterning of the light-sensitive material generally involves exposure by a radiation source through a reticle (and associated optics) of the light-sensitive material using, for example, a photo-lithography system, followed by the removal of the irradiated regions of the light-sensitive material (as in the case of positive photo-resist), or non-irradiated regions (as in the case of negative resist) using a developing solvent. Moreover, this mask layer may comprise multiple sub-layers.

More recently, a double patterning approach has been introduced to allow the patterning of smaller features at a smaller pitch than what is currently possible with standard lithographic techniques. One approach to reduce the feature size is to use standard lithographic pattern and etch techniques on the same substrate twice, thereby forming larger patterns spaced closely together to achieve a smaller feature size than would be possible by single exposure. During double patterning, the substrate is exposed to a first pattern, the first pattern is developed in the light-sensitive material, the first pattern formed in the light-sensitive material is transferred to an underlying layer using an etching process, and then this series of steps is repeated for a second pattern.

SUMMARY OF THE INVENTION

The present invention relates to a method for double patterning a thin film on a substrate.

According to one embodiment, a method of double patterning a thin film using a developable anti-reflective coating (ARC) layer and a developable organic planarization layer (OPL) is described.

According to another embodiment, a method of double patterning a thin film on a substrate is described, comprising: preparing a film stack on the substrate, the film stack comprising the thin film formed on the substrate, a developable organic planarization layer (OPL) formed on the thin film, a developable anti-reflective coating (ARC) layer formed on the developable OPL, and a layer of photo-resist formed on the developable ARC layer; forming a first image pattern in the developable ARC layer comprising the steps of imaging the developable ARC layer with the first image pattern and developing the developable ARC layer to form the first image pattern; forming the first image pattern in the developable OPL comprising the steps of imaging the developable OPL with the first image pattern and developing the developable OPL to form the first image pattern; forming a second image pattern in the developable ARC layer comprising the steps of imaging the developable ARC layer with the second image pattern and developing the developable ARC layer to form the second image pattern; and forming the second image pattern in the developable OPL comprising the steps of imaging the developable OPL with the second image pattern and developing the developable OPL to form the second image pattern.

According to another embodiment, a method of double patterning a thin film on a substrate is described, comprising: preparing a film stack on the substrate, the film stack comprising the thin film formed on the substrate, a developable organic planarization layer (OPL) on the thin film, a developable anti-reflective coating (ARC) layer formed on the developable OPL, and a layer of photo-resist formed on the developable ARC layer; imaging the layer of photo-resist, the developable ARC layer and the developable OPL with a first image pattern; imaging the layer of photo-resist, the developable ARC layer and the developable OPL with a second image pattern; and developing the layer of photo-resist, the developable ARC layer and the developable OPL to form the first image pattern and the second image pattern in the layer of photo-resist, the developable ARC layer and the developable OPL.

According to another embodiment, a method of double patterning a thin film on a substrate is described, comprising: preparing a film stack on the substrate, the film stack comprising the thin film formed on the substrate, a developable organic planarization layer (OPL) on the thin film, a developable anti-reflective coating (ARC) layer formed on the developable OPL, and a layer of photo-resist formed on the developable ARC layer; imaging the layer of photo-resist, the developable ARC layer and the developable OPL with a first image pattern in a photo-lithography system; while the substrate is still in the photo-lithography system, imaging the layer of photo-resist, the developable ARC layer and the developable OPL with a second image pattern; developing the layer of photo-resist, the developable ARC layer and the developable OPL to form the first image pattern and the second image pattern in the layer of photo-resist, the developable ARC layer and the developable OPL; removing the layer of photo-resist following the developing; and transferring the first image pattern and the second image pattern in the developable ARC layer and the developable OPL to the thin film using an etching process.

According to another embodiment, a method of double patterning a thin film on a substrate is described, comprising: preparing a film stack on the substrate, the film stack comprising the thin film formed on the substrate, a developable organic planarization layer (OPL) on the thin film, a developable anti-reflective coating (ARC) layer formed on the developable OPL, and a first layer of photo-resist formed on the developable ARC layer; imaging the first layer of photo-resist, the developable ARC layer and the developable OPL with a first image pattern; developing the first layer of photo-resist, the developable ARC layer and the developable OPL to form the first image pattern in the first layer of photo-resist, the developable ARC layer and the developable OPL; removing the first layer of photo-resist; forming a second layer of photo-resist on the developable ARC layer; imaging the second layer of photo-resist, the developable ARC layer and the developable OPL with a second image pattern; and developing the second layer of photo-resist, the developable ARC layer and the developable OPL to form the second image pattern in the second layer of photo-resist, the developable ARC layer and the developable OPL.

According to yet another embodiment, imaging the first and second image patterns are performed in the same photo-lithography system without transferring the substrate out of the system between the first and second imagings. According to a further embodiment, after developing the first and second image patterns in the developable ARC layer and the developable OPL, the photo-resist is removed, followed by transferring the image patterns to the thin film using an etching process.

BRIEF DESCRIPTION OF THE DRAWINGS

In the accompanying drawings.

DETAILED DESCRIPTION OF EXEMPLARY EMBODIMENTS

In the following description, for purposes of explanation and not limitation, specific details are set forth, such as particular processes and patterning systems. However, it should be understood that the invention may be practiced in other embodiments that depart from these specific details.

Figure 1A:
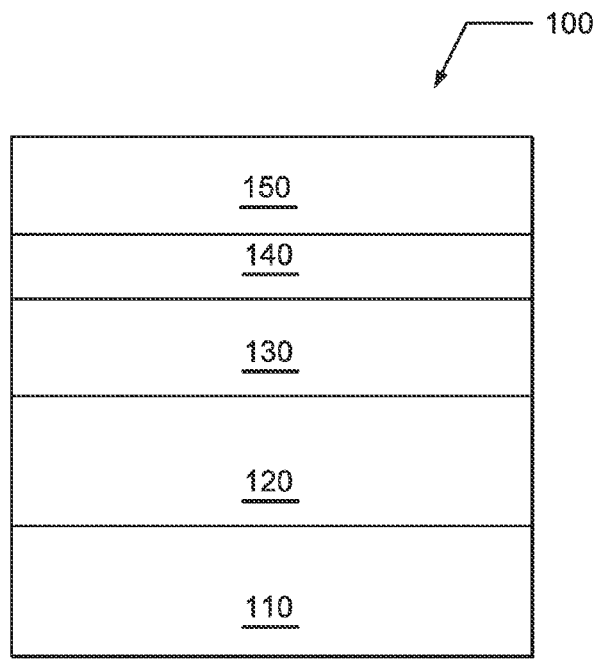
FIGS. 1A through 1J illustrate schematically a known method for double patterning a thin film on a substrate.

As described above, double patterning lithography has been utilized to allow the patterning of smaller features at a smaller pitch than what is currently possible with standard lithographic techniques. Referring now to the drawings wherein like reference numerals designate identical or corresponding parts throughout the several views, FIGS. 1A through 1J schematically illustrate a method of double patterning a substrate according to the prior art. As illustrated in FIG. 1A, a lithographic structure 100 comprises a film stack formed on substrate 110. The film stack comprises a thin film 120, such as a dielectric layer, formed on substrate 110, an organic planarization layer (OPL) 130 formed on the thin film 120, an anti-reflective coating (ARC) layer 140 formed on the OPL 130, and a layer of photo-resist 150 formed on the ARC layer 140.

Figure 1B:
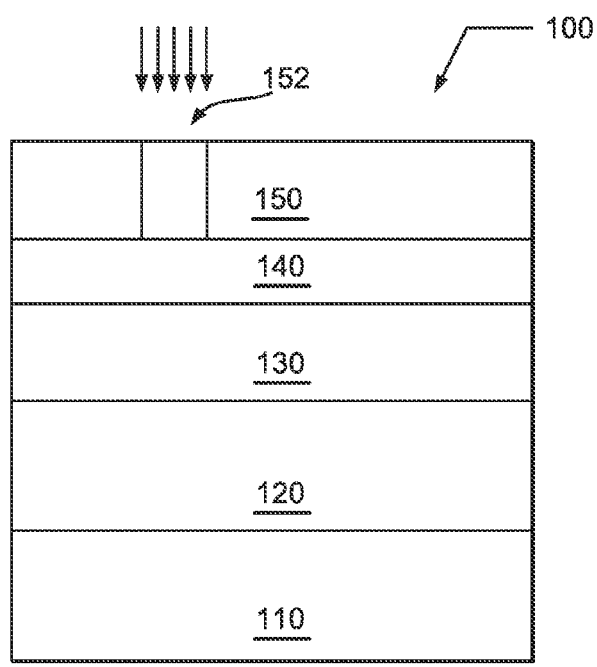
Figure 1C:
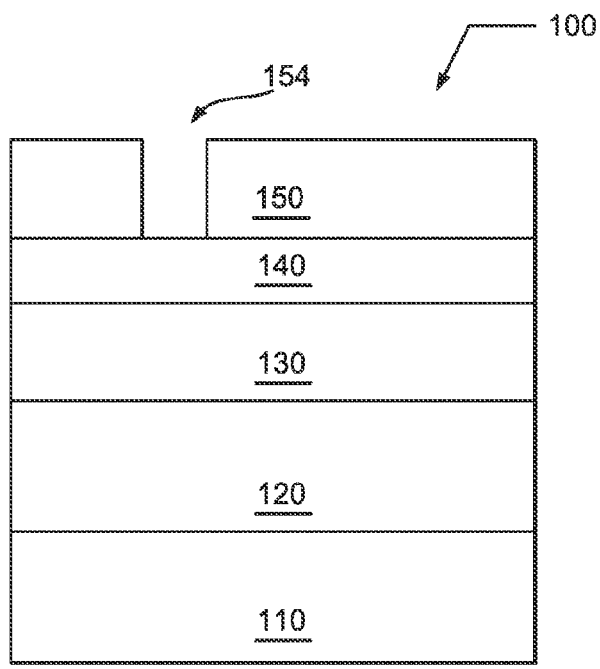
Figure 1D:
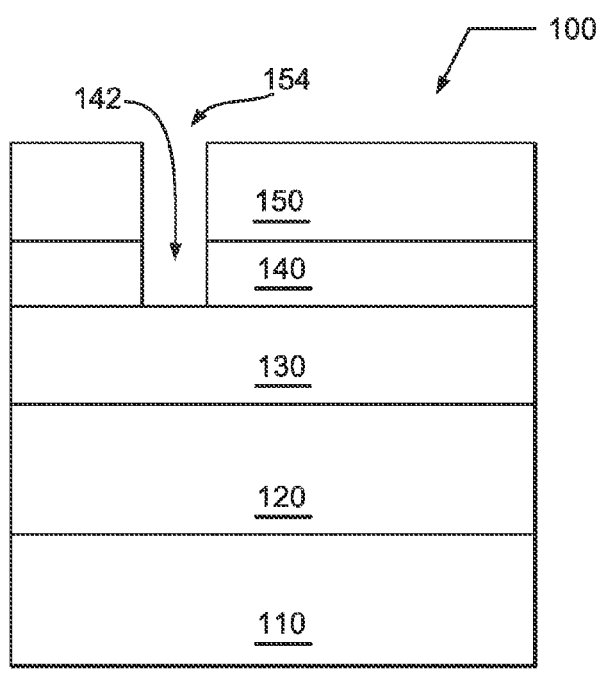

As shown in FIG. 1B, the photo-resist 150 is exposed to a first image pattern 152 using a photo-lithography system, and thereafter in FIG. 1C, the first image pattern 152 is developed in a developing solvent to form a first pattern 154 in the photo-resist layer 150. The first pattern 154 in the photo-resist layer 150 is transferred to the underlying ARC layer 140 using a dry etching process to form a first ARC pattern 142 as shown in FIG. 1D.

Figure 1E:
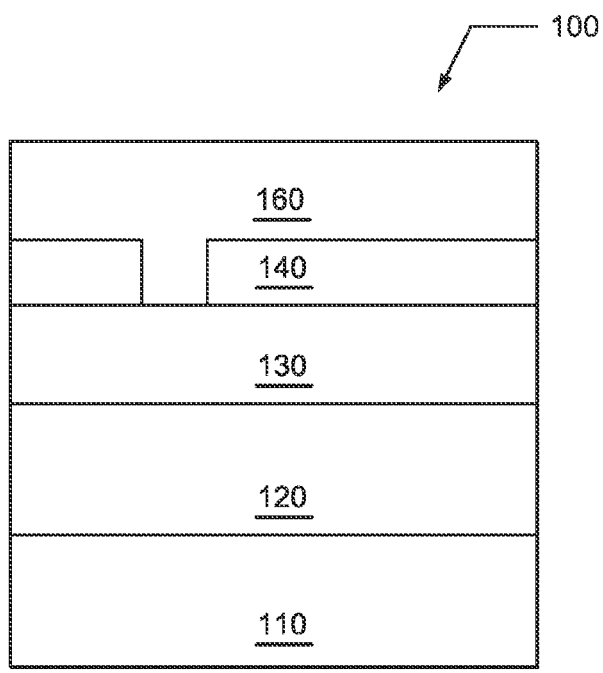
Figure 1F:
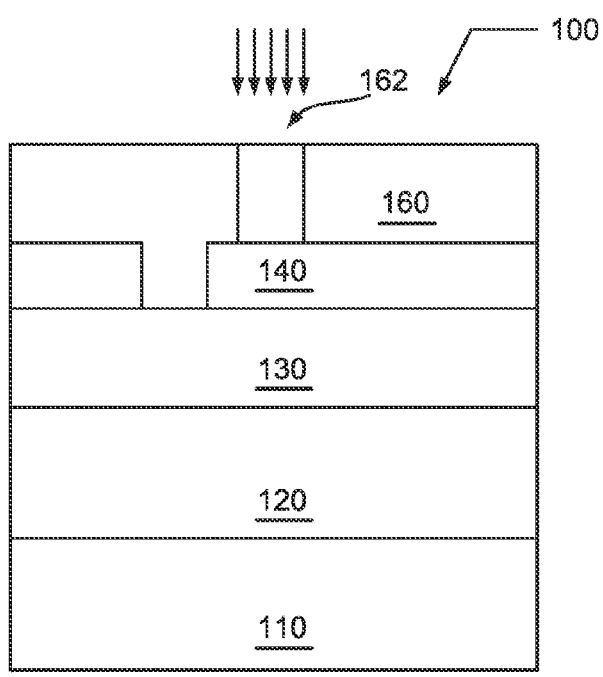
Figure 1G:
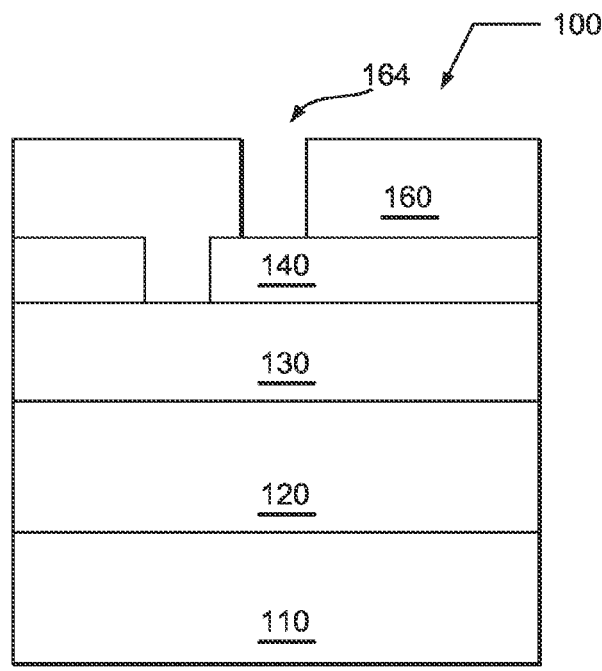
Figure 1H:
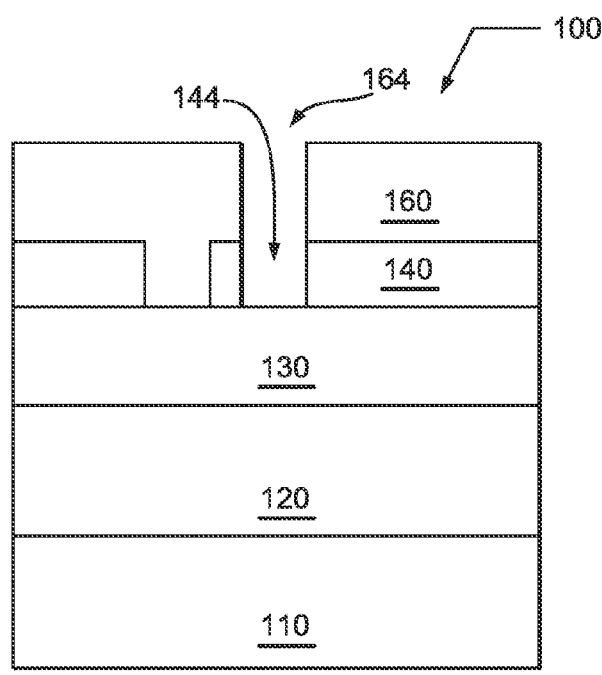

Now, as shown in FIG. 1E, photo-resist layer 150 is removed, and a second photo-resist layer 160 is applied to the ARC layer 140. The second photo-resist layer 160 is exposed to a second image pattern 162, as shown in FIG. 1F, using a photo-lithography system, and thereafter in FIG. 1G, the second image pattern 162 is developed in a developing solvent to form a second pattern 164 in the second photo-resist layer 160. The second pattern 164 in the second photo-resist layer 160 is transferred to the underlying ARC layer 140 using an etching process to form a second ARC pattern 144 as shown in FIG. 1H.

Figure 1I:
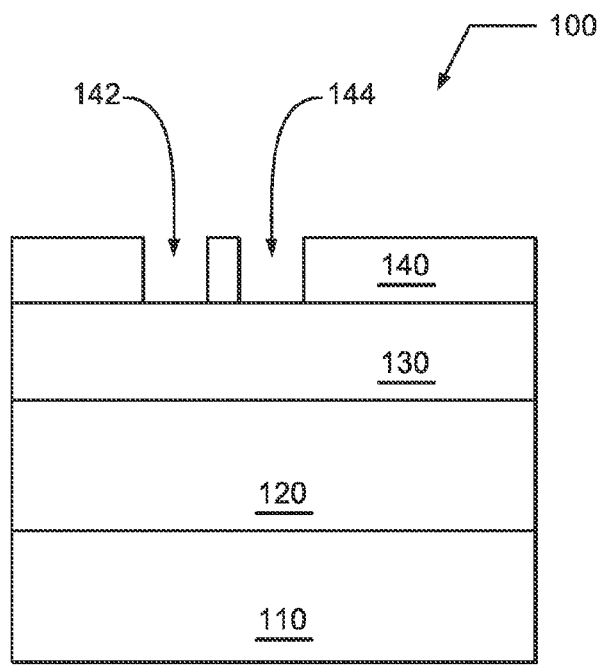
Figure 1J:
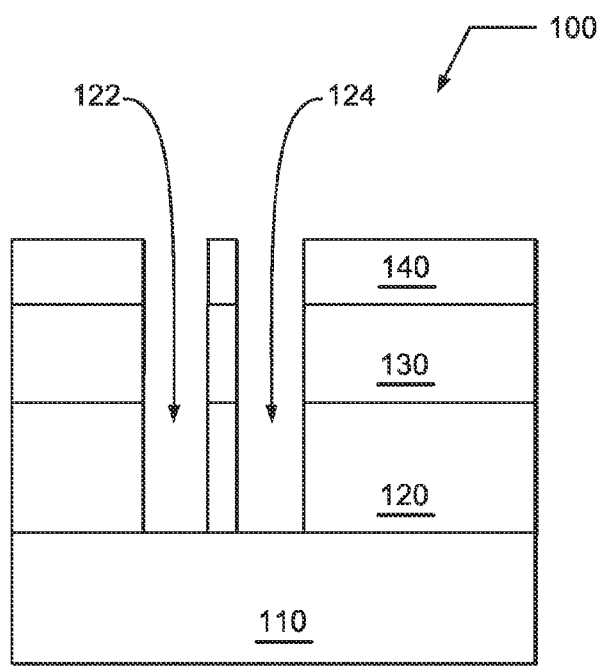

As illustrated in FIGS. 1I and 1J, respectively, the second layer of photo-resist 160 is removed, and the first and second ARC patterns 142 and 144 are transferred to the underlying OPL 130 and the thin film 120 to form a first feature pattern 122 and a second feature pattern 124 using one or more etching processes. However, the use of this procedure to double pattern thin film 120 is costly. For example, the substrate must cycle between the track and lithography systems, and the dry etching system twice, thus doubling the processing time and halving the substrate throughput.

Figure 2A:
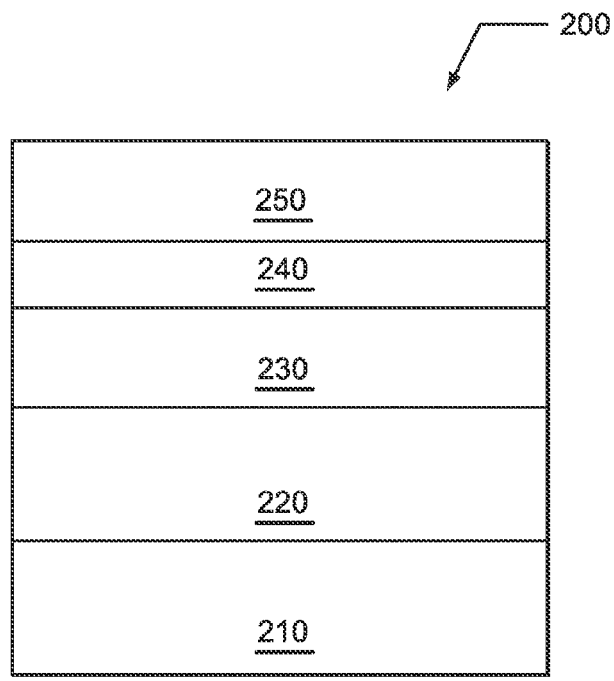
FIGS. 2A through 2H illustrate schematically a method for double patterning a thin film on a substrate according to an embodiment of the invention.
Figure 2B:
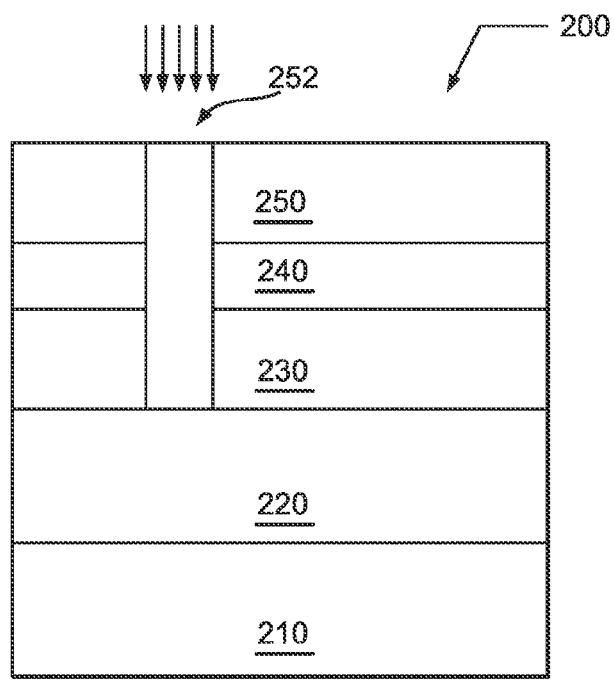
Figure 2C:
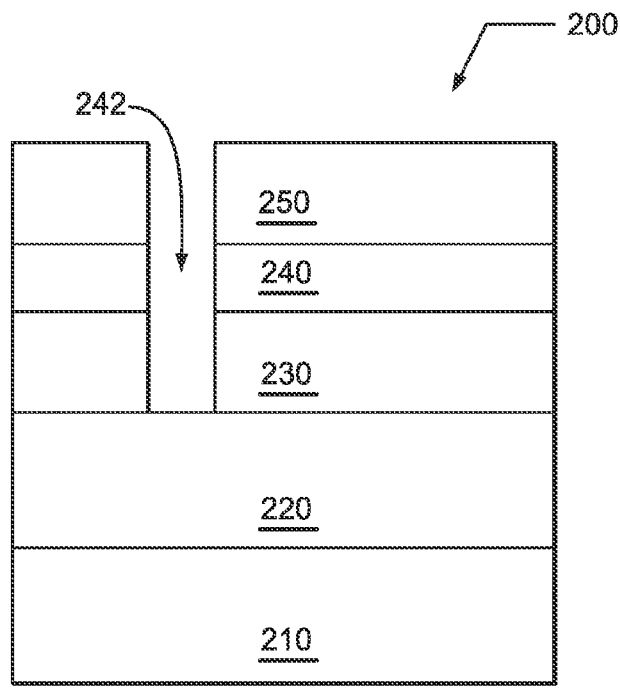
Figure 2D:
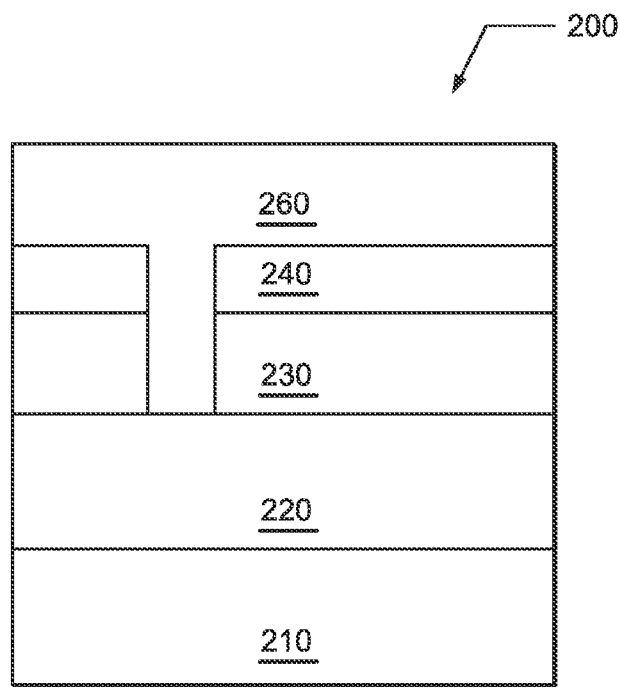
Figure 2E:
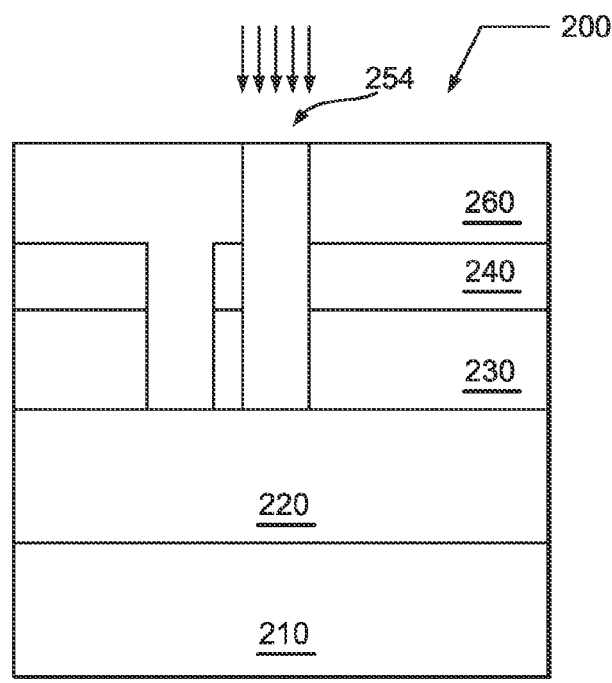
Figure 2F:
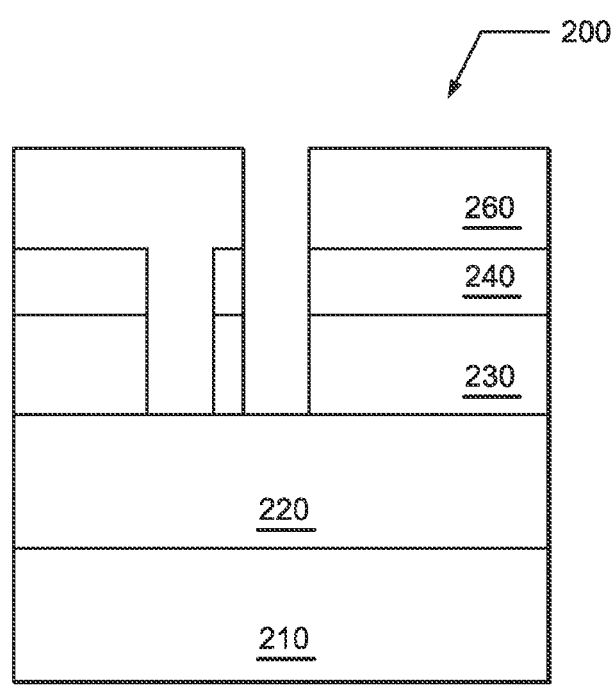
Figure 2G:
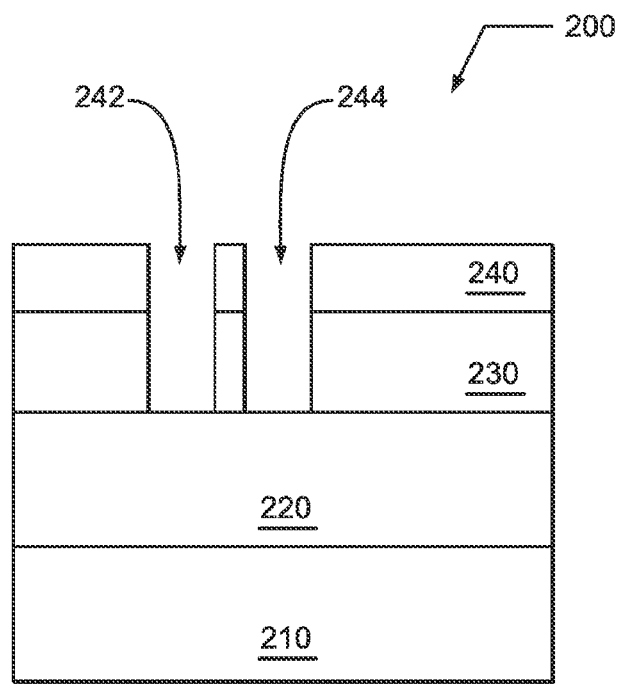
Figure 2H:
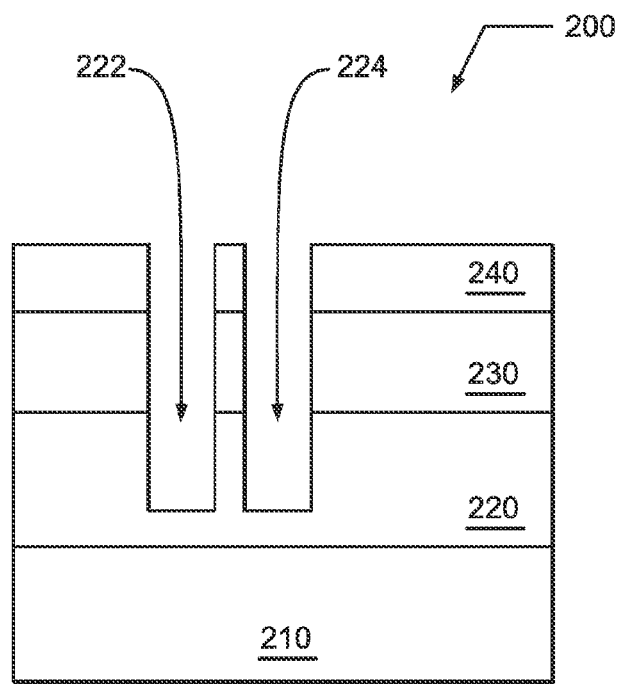
Figure 3:
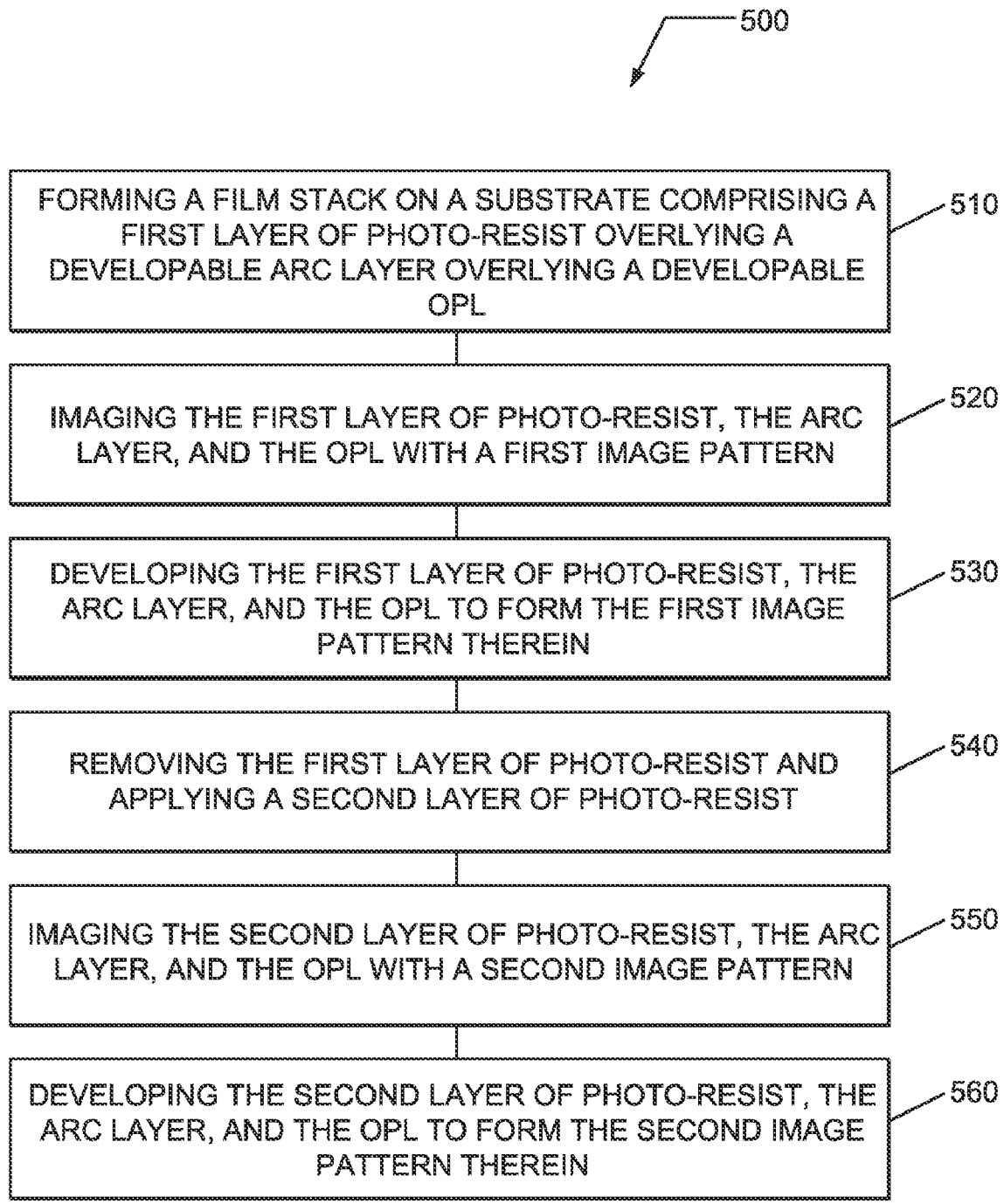
FIG. 3 illustrates a flow chart of a method for double patterning a thin film on a substrate according to an embodiment of the invention.

Therefore, according to an embodiment of the invention, a method of double patterning a substrate is schematically illustrated in FIGS. 2A through 2H, and is illustrated in a flow chart 500 in FIG. 3. The method begins in 510 with forming a lithographic structure 200 comprising a film stack formed on substrate 210. The film stack comprises a thin film 220 formed on substrate 210, a developable organic planarization layer (OPL) 230 formed on the thin film 220, a developable anti-reflective coating (ARC) layer 240 formed on the developable OPL 230, and a first layer of photo-resist 250 formed on the developable ARC layer 240.

The thin film 220 may comprise a conductive layer, a non-conductive layer, or a semi-conductive layer. For instance, the thin film 220 may include a material layer comprising a metal, metal oxide, metal nitride, metal oxynitride, metal silicate, metal silicide, silicon, poly-crystalline silicon (poly-silicon), doped silicon, silicon dioxide, silicon nitride, silicon carbide, or silicon oxynitride, etc. Additionally, for instance, the thin film 220 may comprise a low dielectric constant (i.e., low-k) or ultra-low dielectric constant (i.e., ultra-low-k) dielectric layer having a nominal dielectric constant value less than the dielectric constant of $SiO_2$, which is approximately 4 (e.g., the dielectric constant for thermal silicon dioxide can range from 3.8 to 3.9). More specifically, the thin film 220 may have a dielectric constant of less than 3.7, or a dielectric constant ranging from 1.6 to 3.7.

These dielectric layers may include at least one of an organic, inorganic, or inorganic-organic hybrid material. Additionally, these dielectric layers may be porous or non-porous. For example, these dielectric layers may include an inorganic, silicate-based material, such as carbon doped silicon oxide (or organo siloxane), deposited using CVD techniques. Examples of such films include Black Diamond® CVD organosilicate glass (OSG) films commercially available from Applied Materials, Inc., or Coral® CVD films commercially available from Novellus Systems, Inc. Alternatively, these dielectric layers may include porous inorganic-organic hybrid films comprised of a single-phase, such as a silicon oxide-based matrix having $CH_3$ bonds that hinder full densification of the film during a curing or deposition process to create small voids (or pores). Still alternatively, these dielectric layers may include porous inorganic-organic hybrid films comprised of at least two phases, such as a carbon-doped silicon oxide-based matrix having pores of organic material (e.g., porogen) that is decomposed and evaporated during a curing process. Still alternatively, these dielectric layers may include an inorganic, silicate-based material, such as hydrogen silsesquioxane (HSQ) or methyl silsesquioxane (MSQ), deposited using SOD (spin-on dielectric) techniques. Examples of such films include FOx® HSQ commercially available from Dow Corning, XLK porous HSQ commercially available from Dow Corning, and JSR LKD-5109 commercially available from JSR Microelectronics. Still alternatively, these dielectric layers can comprise an organic material deposited using SOD techniques. Examples of such films include SiLK-I, SiLK-J, SiLK-H, SiLK-D, and porous SiLK® semiconductor dielectric resins commercially available from Dow Chemical, and GX-3™, and GX-3P™ semiconductor dielectric resins commercially available from Honeywell.

The thin film 220 can be formed using a vapor deposition technique, such as chemical vapor deposition (CVD), plasma enhanced CVD (PECVD), atomic layer deposition (ALD), plasma enhanced ALD (PEALD), physical vapor deposition (PVD), or ionized PVD (iPVD), or a spin-on technique, such as those offered in the Clean Track ACT 8 SOD (spin-on dielectric), ACT 12 SOD, and Lithius coating systems commercially available from Tokyo Electron Limited (TEL). The Clean Track ACT 8 (200 mm), ACT 12 (300 mm), and Lithius (300 mm) coating systems provide coat, bake, and cure tools for SOD materials. The track system can be configured for processing substrate sizes of 100 mm, 200 mm, 300 mm, and greater. Other systems and methods for forming a thin film on a substrate are well known to those skilled in the art of both spin-on technology and vapor deposition technology.

The developable OPL 230 can include a photo-sensitive organic polymer comprising a light-sensitive material that, when exposed to electromagnetic (EM) radiation, is chemically altered and thus configured to be removed using a developing solvent. For example, the photo-sensitive organic polymer may be polyacrylate resin, epoxy resin, phenol resin, polyamide resin, polyimide resin, unsaturated polyester resin, polyphenylenether resin, polyphenylenesulfide resin, or benzocyclobutene (BCB). More generally, for example, the developable OPL 230 may comprise any organic polymer and a photo-active compound having a molecular structure that can attach to the molecular structure of the organic polymer. The fabrication of a photo-sensitive organic polymer is understood to one skilled in the art of organic chemistry or polymer chemistry. Furthermore, the developable OPL 230 is selected to be compatible with the overlying developable ARC layer 240, the overlying photo-resist layer 250 and the lithographic wavelength, i.e., ArF, KrF, etc. The developable OPL 230 may, for example, be applied using spin coating technology.

The developable ARC layer 240 possesses material properties suitable for use as an anti-reflective coating. Additionally, the developable ARC layer 240 comprises a light-sensitive material that, when exposed to electro-magnetic (EM) radiation, is chemically altered and thus configured to be removed using a developing solvent. For example, the developable ARC layer 240 may comprise (wet) developable anti-reflective coatings commercially available from Brewer Science. Inc. (2401 Brewer Drive, Rolla, Mont. 65401). Additionally, the developable ARC layer 240 is selected to be compatible with the overlying photo-resist layer 250 and the lithographic wavelength, i.e., ArF, KrF, etc. The developable ARC layer 240 may, for example, be applied using spin coating technology.

The photo-resist layer 250 may comprise 248 nm (nanometer) resists, 193 nm resists, 157 nm resists, or EUV (extreme ultraviolet) resists. The photo-resist layer 250 can be formed using a track system. For example, the track system can comprise a Clean Track ACT 8, ACT 12, or Lithius resist coating and developing system commercially available from Tokyo Electron Limited (TEL). Other systems and methods for forming a photo-resist film on a substrate are well known to those skilled in the art of spin-on resist technology.

In 520 and as shown in FIG. 2B, the first photo-resist layer 250, the developable ARC layer 240 and the developable OPL 230 are imaged with a first image pattern 252. The exposure to EM radiation through a reticle is performed in a dry or wet photo-lithography system. The image pattern can be formed using any suitable conventional stepping lithographic system, or scanning lithographic system. For example, the photo-lithographic system may be commercially available from ASML Netherlands B.V. (De Run 6501, 5504 DR Veldhoven, The Netherlands), or Canon USA, Inc., Semiconductor Equipment Division (3300 North First Street, San Jose, Calif. 95134).

As illustrated in FIG. 2B, the exposure may extend through the entire thickness of the first photo-resist layer 250, the developable ARC layer 240 and the developable OPL 230. Alternatively, the exposure may extend through the entire thickness of the first photo-resist layer 250 and the developable ARC layer 240, and then extend only partially through the thickness of the developable OPL 230.

In 530 and as shown in FIG. 2C, the exposed first photo-resist layer 250, the exposed developable ARC layer 240, and the exposed developable OPL 230 are subjected to a developing process in order to remove the first image pattern 252, and form a first pattern 242 in the developable ARC 240 and the developable OPL 230. The developing process can include exposing the substrate to a developing solvent in a developing system, such as a track system. For example, the track system can comprise a Clean Track ACT 8, ACT 12, or Lithius resist coating and developing system commercially available from Tokyo Electron Limited (TEL).

When the image exposure extends partially through the developable OPL 230 and this partially exposed region is developed, the completion of the pattern transfer to the developable OPL 230 may be performed using an etching process, such as a dry etching process or a wet etching process. The etching process may be performed immediately following the developing process for the first image pattern, for example. Alternatively, the etching process may be performed following the formation of the second image pattern, and the pattern transfer can be completed for the first and second image patterns simultaneously. Alternatively yet, the etching process may be performed following the formation of the second image pattern and the removal of any photo-resist, and the pattern transfer can be completed for the first and second image patterns simultaneously. In doing so, the first and second photo-resist layers 250, 260 may be removed prior to completing the pattern transfer to the developable OPL 230, thereby preventing exposure of the thin film 220 to the photo-resist removal processes.

In 540 and as shown in FIG. 2D, the first layer of photo-resist 250 is removed. For example, the first photo-resist layer 250 may be removed using a wet stripping process, a dry plasma ashing process, or a dry non-plasma ashing process. Thereafter, a second photo-resist layer 260 is formed on the developable ARC layer 240.

The second photo-resist layer 260 may comprise 248 nm (nanometer) resists, 193 nm resists, 157 nm resists, or EUV (extreme ultraviolet) resists. The second photo-resist layer 260 can be formed using a track system. For example, the track system can comprise a Clean Track ACT 8, ACT 12, or Lithius resist coating and developing system commercially available from Tokyo Electron Limited (TEL). Other systems and methods for forming a photo-resist film on a substrate are well known to those skilled in the art of spin-on resist technology.

In 550 and as shown in FIG. 2E, the second photo-resist layer 260, the developable ARC layer 240, and the developable OPL 230 are imaged with a second image pattern 254. The exposure to EM radiation through a reticle is performed in a dry or wet photo-lithography system. The image pattern can be formed using any suitable conventional stepping lithographic system, or scanning lithographic system. For example, the photo-lithographic system may be commercially available from ASML Netherlands B.V., or Canon USA, Inc. Semiconductor Equipment Division.

As illustrated in FIG. 2E, the exposure may extend through the entire thickness of the second photo-resist layer 260, the developable ARC layer 240 and the developable OPL 230. Alternatively, the exposure may extend through the entire thickness of the second photo-resist layer 260 and the developable ARC layer 240, and then extend only partially through the thickness of the developable OPL 230.

In 560 and as shown in FIG. 2F, the exposed second photo-resist layer 260, the exposed developable ARC layer 240, and the exposed developable OPL 230 are subjected to a developing process to remove the second image pattern 254, and form a second pattern 244 in the developable ARC 240 and the developable OPL 230. The developing process can include exposing the substrate to a developing solvent in a developing system, such as a track system. For example, the track system can comprise a Clean Track ACT 8, ACT 12, or Lithius resist coating and developing system commercially available from Tokyo Electron Limited (TEL).

When the image exposure extends partially through the developable OPL 230 and this partially exposed region is developed, the completion of the pattern transfer to the developable OPL 230 may be performed using an etching process, such as a dry etching process or a wet etching process. The etching process may be performed immediately following the developing process for the second image pattern, for example.

As illustrated in FIGS. 2G and 2H, the layer of photo-resist 250 is removed, and the first and second ARC patterns 242 and 244 are transferred to the underlying thin film 220 to form a first feature pattern 222 and a second feature pattern 224 using one or more etching processes. The one or more etching processes may include any combination of wet or dry etching processes. The dry etching processes may include dry plasma etching processes or dry non-plasma etching processes. The one or more etching processes may be designed to consume the developable ARC layer 240.

Other techniques may be utilized to double pattern, or multi-pattern, the developable ARC layer 240 and the developable OPL 230 using a single layer of photo-resist. For example, the single layer of photo-resist may be double imaged as described in pending U.S. patent application Ser. No. 11/534,261, entitled "METHOD FOR DOUBLE IMAGING A DEVELOPABLE ANTI-REFLECTIVE COATING", filed on Sep. 22, 2006, and then removed following the developing of the double pattern in the underlying developable ARC layer and the underlying developable OPL. Alternatively, for example, the single layer of photo-resist may be imaged and developed while the developable ARC layer is developed and the developable OPL is partially developed, and these steps may be repeated with the same layer of photo-resist as described in co-pending U.S. patent application Ser. No. 11/534,365, entitled "METHOD FOR DOUBLE PATTERNING A DEVELOPABLE ANTI-REFLECTIVE COATING", filed on Sep. 22, 2006. The entire contents of these applications are herein incorporated by reference in their entirety.

Although only certain embodiments of this invention have been described in detail above, those skilled in the art will readily appreciate that many modifications are possible in the embodiments without materially departing from the novel teachings and advantages of this invention. For example, several embodiments illustrate the use of positive tone developable resists and developable ARC layers; however, other embodiments are contemplated that utilize negative tone developable resists and developable ARC layers. Accordingly, all such modifications are intended to be included within the scope of this invention.

What is claimed is:

1. A method of double patterning a thin film on a substrate, comprising:

preparing a film stack on said substrate, said film stack comprising said thin film formed on said substrate, a developable organic planarization layer (OPL) formed on said thin film, a developable anti-reflective coating (ARC) layer formed on said developable OPL, and a layer of photo-resist formed on said developable ARC layer;

forming a first image pattern in said developable ARC layer comprising the steps of imaging said developable ARC layer with said first image pattern and developing said developable ARC layer to form said first image pattern;

forming said first image pattern in said developable OPL comprising the steps of imaging said developable OPL with said first image pattern and developing said developable OPL to form said first image pattern;

forming a second image pattern in said developable ARC layer comprising the steps of imaging said developable ARC layer with said second image pattern and developing said developable ARC layer to form said second image pattern; and forming said second image pattern in said developable OPL comprising the steps of imaging said developable OPL with said second image pattern and developing said developable OPL to form said second image pattern.

2. The method of claim 1, wherein said forming said first image pattern in said developable OPL comprises imaging said developable OPL to a depth less than the thickness of said developable OPL and developing said developable OPL to form said first image pattern partially extending into said developable OPL to said depth.

3. The method of claim 2, wherein said forming said first image pattern in said developable OPL further comprises completing the transfer of said first image pattern into said developable OPL by performing a dry etching process to extend said first image pattern from said depth in said developable OPL through the thickness of said OPL.

4. The method of claim 1, wherein said forming said second image pattern in said developable OPL comprises imaging said developable OPL to a depth less than the thickness of said developable OPL and developing said developable OPL to form said second image pattern partially extending into said developable OPL to said depth.

5. The method of claim 4, wherein said forming said second image pattern in said developable OPL further comprises completing the transfer of said second image pattern into said developable OPL by performing a dry etching process to extend said second image pattern from said depth in said developable OPL through the thickness of said OPL.

6. The method of claim 1, further comprising:
removing said layer of photo-resist following said developing of said first image pattern in said developable ARC layer and said developable OPL and said developing of said second image pattern in said developable ARC layer and said developable OPL.

7. The method of claim 1, further comprising:
removing said layer of photo-resist following said developing of said first image pattern in said developable ARC layer and said developable OPL;
following said removal of said layer of photo-resist and before forming said second image pattern, applying another layer of photo-resist; and
removing said another layer of photo-resist following said developing of said second image pattern in said developable ARC layer and said developable OPL.

8. The method of claim 1, further comprising:
transferring said first image pattern and said second image pattern in said developable ARC layer and said developable OPL to said thin film using an etching process.

9. The method of claim 8, wherein said transferring comprises performing a wet etching process, or a dry etching process, or a combination thereof.

10. The method of claim 1, wherein said preparing said film stack comprises forming a 248 nm photo-resist, a 193 nm photo-resist, a 157 nm photo-resist, or an EUV photo-resist, or a combination of two or more thereof on said developable ARC layer.

11. The method of claim 1, wherein said imaging said first image pattern comprises imaging a first image pattern using a dry lithography system, or a wet lithography system, or both.

12. The method of claim 1, wherein said imaging said first image pattern comprises imaging a first image pattern using a 248 nm photo-lithography system, a 193 nm photo-lithography system, a 157 mm photo-lithography system, or an EUV photo-lithography system, or a combination of two or more thereof.

13. The method of claim 1, wherein said imaging said second image pattern comprises imaging a second image pattern using a dry lithography system, or a wet lithography system, or both.

14. The method of claim 1, wherein said imaging said second image pattern comprises imaging a second image pattern using a 248 nm photo-lithography system, a 193 nm photo-lithography system, a 157 nm photo-lithography system, or an EUV photo-lithography system, or a combination of two or more thereof.

15. The method of claim 1, wherein said imaging said first image pattern and said imaging said second image pattern comprise imaging said first image pattern and said second image pattern in the same photo-lithography system without transferring said substrate out of the photo-lithography system between said imaging said first image pattern and imaging said second image pattern.

16. The method of claim 1, wherein said preparing said film stack comprises forming said developable OPL configured for 248 nm photo-lithography, 193 nm photo-lithography, 157 nm photo-lithography, or EUV photo-lithography.

17. The method of claim 1, wherein said second image pattern is imaged at a distance that is spaced apart from said first image pattern by a distance that is greater than zero and less than or equal to approximately 50 nm.

18. A method of double patterning a thin film on a substrate, comprising:
preparing a film stack on said substrate, said film stack comprising said thin film formed on said substrate, a developable organic planarization layer (OPL) on said thin film, a developable anti-reflective coating (ARC) layer formed on said developable OPL, and a layer of photo-resist formed on said developable ARC layer;
imaging said layer of photo-resist, said developable ARC layer and said developable OPL with a first image pattern;
imaging said layer of photo-resist, said developable ARC layer and said developable OPL with a second image pattern; and
developing said layer of photo-resist, said developable ARC layer and said developable OPL to form said first image pattern and said second image pattern in said layer of photo-resist, said developable ARC layer and said developable OPL.

19. A method of double patterning a thin film on a substrate, comprising:
preparing a film stack on said substrate, said film stack comprising said thin film formed on said substrate, a developable organic planarization layer (OPL) on said thin film, a developable anti-reflective coating (ARC) layer formed on said developable OPL, and a layer of photo-resist formed on said developable ARC layer;
imaging said layer of photo-resist, said developable ARC layer and said developable OPL with a first image pattern in a photo-lithography system;
while said substrate is still in said photo-lithography system, imaging said layer of photo-resist, said developable ARC layer and said developable OPL with a second image pattern;
developing said layer of photo-resist, said developable ARC layer and said developable OPL to form said first image pattern and said second image pattern in said layer of photo-resist, said developable ARC layer and said developable OPL;
removing said layer of photo-resist following said developing; and
transferring said first image pattern and said second image pattern in said developable ARC layer and said developable OPL to said thin film using an etching process.

20. A method of double patterning a thin film on a substrate, comprising:
preparing a film stack on said substrate, said film stack comprising said thin film formed on said substrate, a developable organic planarization layer (OPL) on said thin film, a developable anti-reflective coating (ARC) layer formed on said developable OPL, and a first layer of photo-resist formed on said developable ARC layer;
imaging said first layer of photo-resist, said developable ARC layer and said developable OPL with a first image pattern;
developing said first layer of photo-resist, said developable ARC layer and said developable OPL to form said first image pattern in said first layer of photo-resist, said developable ARC layer and said developable OPL;
removing said first layer of photo-resist;
forming a second layer of photo-resist on said developable ARC layer;

imaging said second layer of photo-resist, said developable ARC layer and said developable OPL with a second image pattern; and developing said second layer of photo-resist, said developable ARC layer and said developable OPL to form said second image pattern in said second layer of photo-resist, said developable ARC layer and said developable OPL.

21. The method of claim 20, wherein said second image pattern is imaged at a distance that is spaced apart from said first image pattern by a distance that is greater than zero and less than or equal to approximately 50 nm.

22. The method of claim 20, wherein said first layer of photo-resist, said developable ARC and said second layer of photo-resist are each positive tone developable.

* * * * *

UNITED STATES PATENT AND TRADEMARK OFFICE
CERTIFICATE OF CORRECTION

| | | |
|---|---|---|
| PATENT NO. | : 7,932,017 B2 | Page 1 of 1 |
| APPLICATION NO. | : 11/623237 | |
| DATED | : April 26, 2011 | |
| INVENTOR(S) | : Shannon W. Dunn | |

It is certified that error appears in the above-identified patent and that said Letters Patent is hereby corrected as shown below:

Column 9, Line 44, Claim 12, "157 mm" should read --157 nm--.

Signed and Sealed this
Fourteenth Day of June, 2011

David J. Kappos
*Director of the United States Patent and Trademark Office*